JUNCTION FIELD EFFECT TRANSISTOR AND METHOD OF FABRICATION

Filed June 1, 1971

2 Sheets-Sheet 1

INVENTOR
Ian H. Morgan
BY Richard L. Donaldson
ATTORNEY

United States Patent Office 3,725,136

Patented Apr. 3, 1973

3,725,136
JUNCTION FIELD EFFECT TRANSISTOR AND METHOD OF FABRICATION

Ian H. Morgan, Richardson, Tex., assignor to Texas Instruments Incorporated, Dallas, Tex.

Filed June 1, 1971, Ser. No. 148,764
Int. Cl. H01l 11/14, 7/54
U.S. Cl. 148—1.5 8 Claims

ABSTRACT OF THE DISCLOSURE

A junction field effect transistor is fabricated in an intrinsic silicon substrate. Using ion implantation is utilized to control the impurity profile of the channel and electron beam pattern definition provides an extremely narrow gate region providing a JFET having near optimum characteristics.

This invention relates to semiconductor devices in general and, more specifically, to an improved junction field effect transistor and method of fabrication.

Recent developments in the fabrication of field effect devices have emphasized the need to avoid overlap between the gate electrode and the source or drain regions in order to reduce Miller-type capacitance and thereby increase the frequency range of the device. For example, various gate technologies have been reported, including the use of the patterned gate electrode as a diffusion mask. This approach has been somewhat successful in reducing Miller-type capacitance in MOS devices, but transistors that operate at still higher frequencies are required.

Conventional fabrication techniques for forming, for example, a junction field effect transistor (JFET) all include diffusion steps. The diffusions are effected at high temperatures, typically in the range of from 1100°–1200° C. such that dopants diffuse into the crystals as a result of energy supplied to the lattice. Dopant profiles are restricted to those resulting from Fick's law, thus limiting the device performance. The uneven dopant profile produced in the channel region in particular adversely affects the device performance characteristics. In addition, the high temperature processing steps often cause material degradation due to introduction of growth lattice defects. Also, considerable contamination problems can result in view of the high temperatures involved and the chemical nature of the commonly used dopant sources. For example, it is extremely difficult to maintain the resistivity of silicon when it is heated to high temperatures above, e.g., 900° C. For instance, extremely long annealing times may be required and/or refined processing and cleaning steps. Such procedures are difficult to implement consistently in a production environment. While annealing compensates for some of the change in resistivity due to elevated temperature processing there is often a certain amount of irreversible change in resistivity. In accordance with the present invention, however, low temperature processes may be utilized and the high resistivity of the substrate maintained, providing reproducible devices with greatly improved characteristics.

In general, several factors influence the operation characteristics of a JFET. For instance, to optimize performance, the metal overlap of the gate to the drain and source regions should be minimized since the maximum bandwidth achievable at a given frequency is inversely proportional to the total shunt capacitance. Thus, for good bandwidth concurrent with high gain, shunt capacitance should be minimized. Ideally, this capacitance should consist of only the active gate capacitance since the lower the feedback capacitance is, the higher the available gain that can be achieved stably without neutralization. In conventional JFET fabrication techniques, however, an N over P epitaxial structure is utilized that requires high temperature isolation diffusion for long periods of time. The isolation junctions generally introduce large amounts of stray capacitance. In addition, when the epitaxial process is used, there is generally no attempt at reducing source and drain resistance due to the difficulty in diffusing in the small area geometries. Thus, the resistivity of the source and drain regions in these devices is typically the same as the channel region. Optionally, however, the source and drain resistance should be minimized. Because of the relatively low transconductance of the MOSFET in general, much of the power gain is realized due to the high impedance levels involved. Contact resistance lowers the Q and effective impedance of input and output circuitry, thus resulting in gain degradation of the circuit. An additional factor that influences the operating characteristics of a JFET is the resistance of the substrate in which the source and drain regions are formed. Ideally, the substrate should have a high resistivity. The problem to date, however, is the fact that diffusion techniques inherently limit the resistivity which may be maintained in the substrate, i.e., at the high temperatures required for diffusion, the resistivity of the substrate is adversely affected.

Accordingly, an object of the present invention is to produce an improved JFET.

An additional object of the invention is to produce a JFET having a more uniform impurity profile in the channel region of the device.

Another object of the invention is to produce an extremely narrow channel in a JFET structure to enable high frequency operation.

Still another object of the invention is to minimize the RC loss and capacitance attributable to the gate region of a JFET.

Briefly, in accordance with the present invention, a JFET having optimized operating characteristics is disclosed. The JFET is formed in a high resistivity silicon substrate; the source, drain and gate regions are formed by ion implantation at low temperatures, i.e., below 900° C., enabling maintenance of the high resistivity in the substrate. In addition, using phosphorous ions and annealing at up to 900° C., a device having better lifetime than conventional tube diffusion is produced. This is particularly advantageous in that n-channel devices have superior mobility and correspondingly operate at higher frequencies. Electron beam patterning is used to define an extremely narrow channel. The gate is formed to define a meandering pattern to produce a maximum channel length in the area of the substrate required for the JFET in order to minimize gate capacitance. Bonding pads are formed at each end of the gate so that the gate signal may simultaneously be applied at both locations to effect an effective channel length one-half the actual length, thereby minimizing the RC loss associated with the surface sheet resistance of the gate region. In one aspect of the invention, a series of implantations is effected to control the channel impurity profile to improve device characteristics. In a different aspect of the invention, the gate region is defined by a Schottky barrier.

Figure 1:
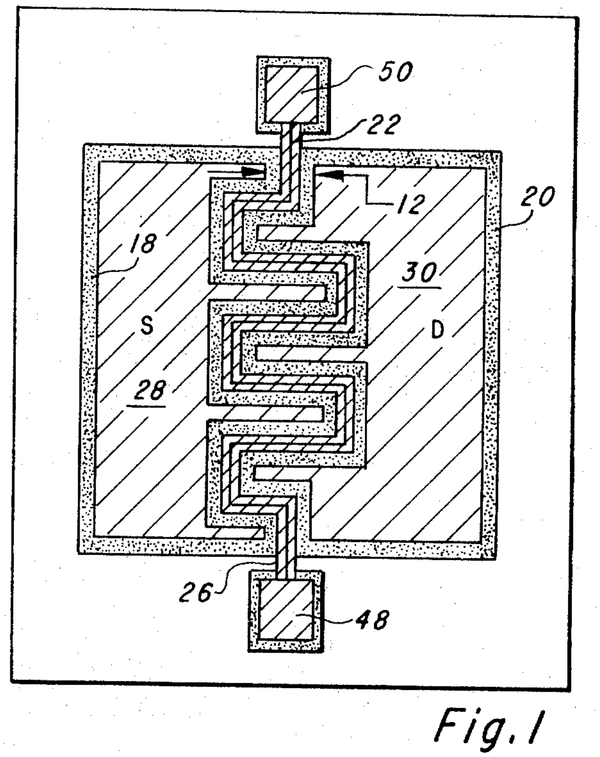
FIG. 1 is a plan view of a JFET in accordance with the present invention.
Figure 2:
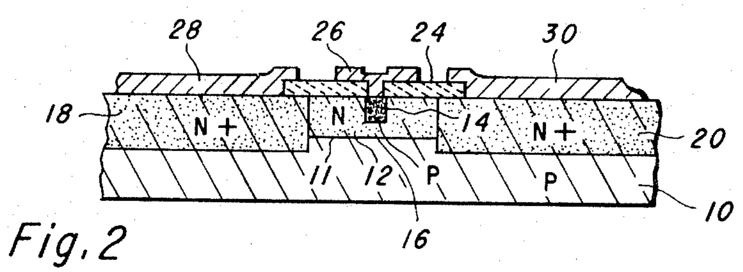
FIG. 2 is a sectional view along line A–A' of FIG. 1.

Referring to FIGS. 1 and 2, a JFET in accordance with the present invention is illustrated. A high resistivity substrate is shown at 10. Preferably, the substrate is P-type silicon, although N-type silicon or other semiconductor materials may be utilized if desired. The present invention is effective to maintain the resistivity of a p-type substrate having a resistivity from 5 ohm-cm. to 200 ohm-cm. or higher. The substrate 10 may comprise a small portion of the surface of a slice of silicon which may, for example, be on the order of 2 to 3 inches in diameter and 15 mils thick. High resistivity silicon is used to provide resistive isolation and to minimize capacitance of the device. As will be explained hereinafter, the method of the present invention enables the high resistivity of the substrate to be maintained.

In the following discussion, it will be assumed that p-type high resistivity silicon is used as a substrate 10. For such a situation, an n-doped channel is formed in the region 12. A p-type gate shown by the speckled region 14 is formed within the channel 12. As may be seen most clearly in FIG. 2, the region 16 underlying the gate 14 and between the gate 14 and the surface 11 of the substrate 10 defines the channel of the JFET. Ohmic contacts 18 and 20 for the source and drain respectively, comprise n+ regions in the surface of the substrate 10. The p-n junction formed by the gate is shown in FIG. 1 by the line 22. An insulating layer 24 is formed over the channel region 12 and extends over a portion of the contact regions 18 and 20, respectively. An aperture is opened in the insulating layer 24 for contact to the gate 14. A metal layer 26 is formed over the insulating layer and through the aperture to make contact to the gate 14. Aluminum contacts 28 and 30 are formed over the source and drain n+ contact regions 18 and 20.

With reference to FIG. 2, the process for fabricating the JFET illustrated in FIG. 1 may more readily be understood. As previously mentioned, the starting material for the substrate 10 may comprise p-type high resistivity silicon, i.e., 5–200 ohm-cm., or very high n-type, i.e., greater than 1000 ohm-cm., giving resistive isolation and extremely low capacitance. A mask, not shown, is formed over the surface of the substrate 10 and is patterned to define the channel region 12. Various techniques, such as conventional photolithographic masking and etching may be used to pattern the substrate.

It is preferred, however, that electron beam patterning be used to produce very small geometries for high frequency devices. Techniques for electron beam patterning are well-known in the art; reference, for example, copending application Ser. No. 51,257, filed June 30, 1970 entitled "Method and Apparatus for the Production of Semiconductive Devices by Electron Beam Patterning and Devices Produced Thereby" assigned to the same assignee as the present invention.

In the next step of fabrication, an ion beam is directed to impinge upon the surface of the substrate 10 and the mask thereover. In regions where the mask is absent, the ions will penetrate into the substrate 10 to form the channel region 12. Various ions, such as phosphorous, known to those skilled in the art for converting p-type material to n-type may be used. The ion implantation and subsequent annealing may be effected at low temperatures, i.e., below 900° C., and thus the "intrinsic" nature of the silicon substrate 10 is not affected. The channel region 12, as shown in FIG. 1, is defined in a meandering pattern over the region of the substrate required for the JFET. The purpose of forming such a meandering or interdigitated pattern as to produce as much channel as possible in a small region of the substrate to reduce capacitance.

Figure 4:
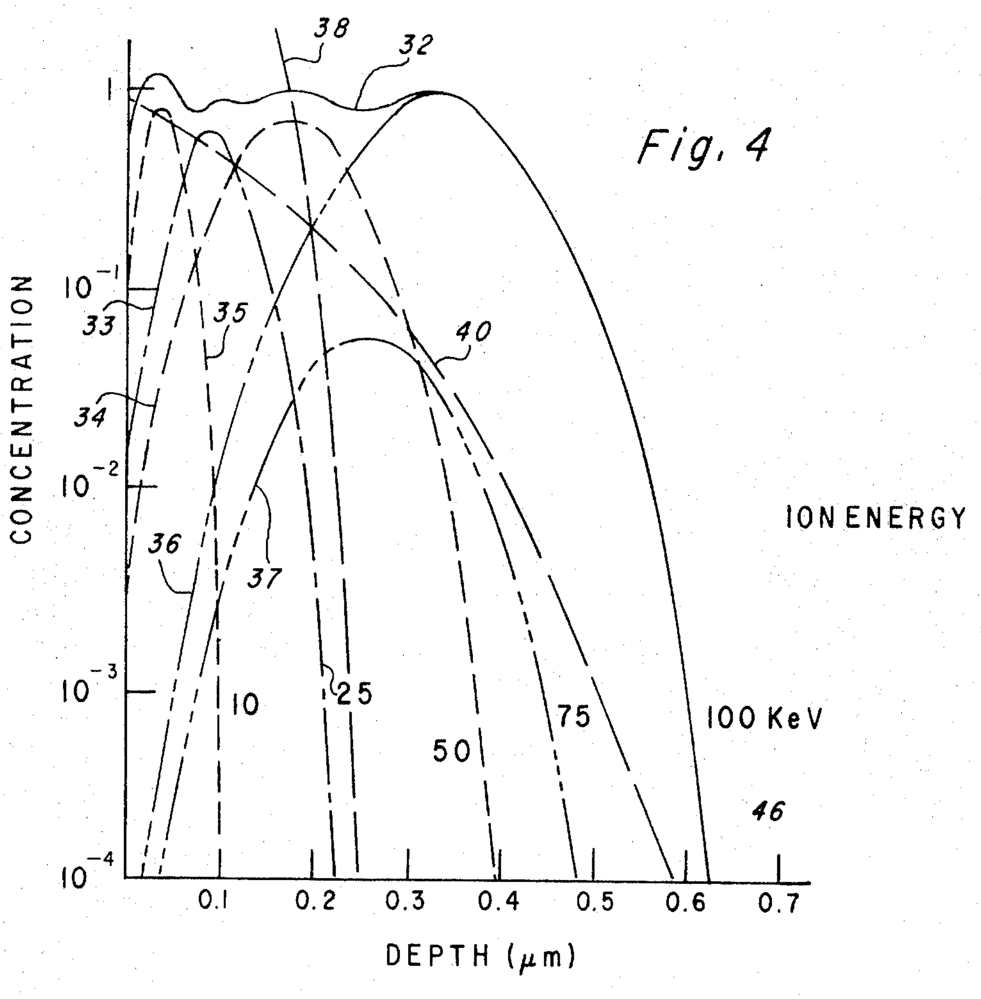
FIG. 4 is a graph illustrating the impurity profile which may be obtained in accordance with the present invention.

One important advantage of forming the channel region by ion implantation techniques results from the fact that the impurity profile in the channel region may be accurately controlled to any desired shape. For example, in FIG. 4, there is depicted a graph of impurity concentration versus depth below the surface of the semiconductor material 10. The impurity profile is shown by the graph 32, and as may be seen, a substantially uniform dopant concentration as a function of depth may be obtained. The profile 32 is the composite of a series of separate ion implants 33–37, i.e., the profile 32 is the gaussian summation of the individual implantations. The p-n junction, such as 22, FIG. 1, may be formed at a depth, for example, shown at 38. The impurity profile that may be obtained by diffusion techniques is shown by the graph 40. As may be seen, in the region between the p-n junction 38 and the boundary 46 of the channel, the impurity profile resulting from diffusion techniques is very nonuniform. As understood by those skilled in the art, this nonuniformity significantly degrades device performance characteristics.

In the next step of fabrication, n+ contact regions for the source and drain of the JFET are formed by implanting, for example, with phosphorous to reduce resistance therein. These regions may be formed by masking the channel region during the implant. Alternatively, the regions 18 and 20 may remain unmasked during implantation of the channel region 12 and then subsequently receive additional implanted ions with the channel region 12 masked. An insulating layer 24 is next formed over the channel 12 by conventional low temperature techniques and electron beam patterning is utilized to form an aperture 25 for the formation of the gate region 14. The order of forming the source and drain and channel is not critical and will vary depending on design considerations. Using electron beam patterning, the aperture may be controlled to an extremely narrow width in the range of 1 micron or less. P-type ions are then implanted into the channel region 12 to define the gate. For example, boron, gallium, aluminum or other dopants that are p-type with respect to silicon may be used. Since the channel width may be controlled to be extremely small, the transit time of charge carriers is correspondingly very small and thus the frequency of operation is maximized. To further increase the frequency, a highly conductive material 26, such as aluminum, is formed over a portion of the insulating layer 24 to extend through the aperture 25 and make contact with the gate region 14. The highly conductive region 26 serves to reduce the RC loss due to the surface sheet resistance of the implanted gate region at high frequency.

Bonding pads 48 and 50 are formed to make contact with both ends of the gate 14. This enables the gate signal to be simultaneously applied to regions 48 and 50 to produce an effective channel length one-half the actual distance between the regions 48 and 50. A highly conductive contact such as aluminum is made to the source and drain doped regions 28 and 30 to complete fabrication of the device.

Figure 3:
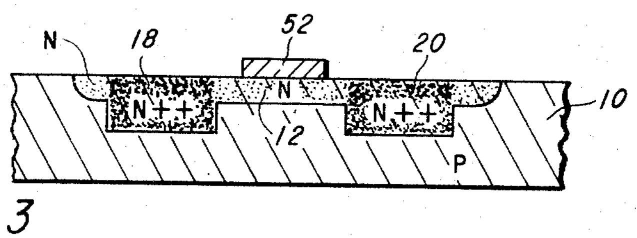
FIG. 3 is a sectional view along line A–A' illustrating a different embodiment of the invention.

With reference to FIG. 3, an alternate embodiment of the present invention is depicted. In this embodiment the same fabrication techniques as described with reference to FIG. 2 are utilized except that the gate diffusion through an insulating layer 24 is not effected. In the embodiment shown in FIG. 3, a metal layer 52 is formed over the channel region 12 in a rectifying contact manner to form a Schottky barrier gate. Since the gate region may be formed by electron beam patterning to be very narrow and since the gate is formed in the meandering pattern as illustrated in FIG. 1, many of the same advantages that may be achieved with the embodiments of FIGS. 1 and 2 may also be achieved in the embodiment of FIG. 3. In addition, since the implantation for the channel region 12 is very shallow, the gate being formed at the surface of the substrate, the impurity profile of the channel can be controlled more precisely. This enables more uniform and reproducible devices to be fabricated. The n+ source and drain regions 18 and 20 may be implanted to a greater depth than the channel 12, if desired. A highly conductive contact layer (not shown) may be formed over the source and drain n+ regions.

Figure 5:
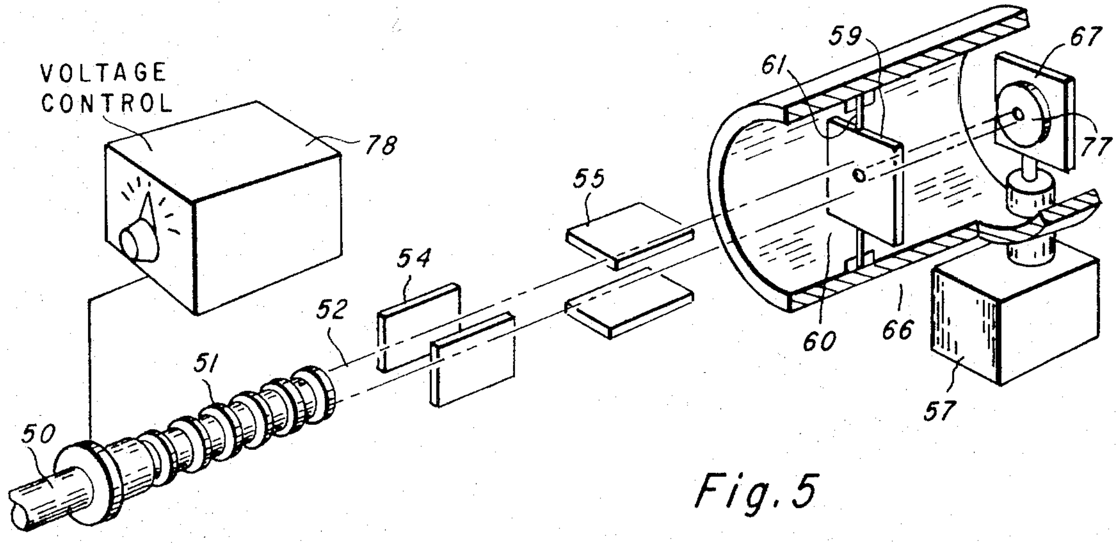
FIG. 5 illustrates apparatus that may be used to effect ion implantation steps of the present invention.

With reference to FIG. 5, there is depicted an exemplary arrangement of apparatus by which the ion implantation steps of the present invention may be practiced. It is understood, of course, that other arrangements of equipment may be used. The apparatus basically comprises an ion source 50 mounted at one end of an accelerator tube 51. Ions, in the form of a beam 52, emerge from the accelerator tube and pass through a deflection system which may be comprised of horizontal scanner plates 54 and vertical scanner plates 55. This deflection system is used to direct the beam such that it is focused on a plate 59 which has a suitably dimensioned aperture 60 therein. This plate is rigidly held in an evacuated chamber 66 between a slice 77 which may, for example, comprise a plurality of the JFET's illustrated in FIG. 1 and the ion source 50 by a suitable fixture 61. The sample holder 67, upon which the slice 77 is mounted, is fixed to an index assembly 57 which moves the assembly so that only one portion of the surface of the slice 77 is exposed to the beam which passes through the aperture 60.

The indexing system in conjunction with the aperture permits precise control of the ion beam, enabling bombardment of the discrete selected areas of the surface of the slice 77. Such control ensures that when the ion current passes through the aperture an impinging on the slice is maintained constant. Each radiated portion of the slice receives exactly the same intensity of radiation. Alternatively, the current passing through the aperture may be integrated using a commercially available electrometer device and the slice indexed after a predetermined charge is impinged upon the specified area of the slice surface. The ion source 50 and the accelerator tube 51 may comprise a relatively high energy ion beam accelerator from about 50,000 volts to several million electron volts. Means for varying the accelerating energy are shown in block diagram form at 78. Such voltage regulator means are known to those skilled in the art and need not be described in more detail herein.

As may be seen from the above discussion, numerous advantages may be accomplished in accordance with the present invention. Specifically, a junction field effect transistor may be fabricated that has optimized operating characteristics. Such a device may be fabricated since ion implantation techniques enable precise control of the profile in the channel region and allows use of a very high resistivity substrate, further reducing capacitance losses and enabling high frequency operation. Further, using electron beam patterning techniques, the width of the channel may be controlled to a very narrow value in the range, for example, of 1 micron or less, producing devices having improved uniformity. By forming the channel region in a meandering pattern and forming gate contacts at both ends thereof, the RC loss due to the sheet resistance of the gate electrode may be minimized and the capacitance of the gate electrode may also be minimized, both features of which contribute to optimizing the device characteristics.

Specific examples of the invention have been described. It will be apparent to a person skilled in the art, however, that various modifications to the details of construction may be made without departing from the scope or spirit of the invention.

What is claimed is:

1. A method for fabricating a JFET having improved operating characteristics comprising the steps of:

(a) implanting conductivity modifying ions through a first patterned mask over a high resistivity substrate of one conductivity type to form a first region of opposite conductivity extending to the surface thereof;

(b) implanting conductivity modifying ions through a second patterned mask to convert regions laterally adjacent opposite sides of the center portion of said first region to relatively high conductivity regions, thereby forming contact pads for the source and drain respectively, the center portion of said first region defining the channel of said JFET;

(c) forming an insulating mask over said center portion;

(d) patterning said insulating layer with an electron beam to open a narrow aperture therethrough having a width of about one micron;

(e) implanting conductivity modifying ions through said conductivity type, thereby forming the gate of said JFET, the portion of said first region under said gate defining the channel of said JFET; and (f) forming a layer of high conductivity material over said insulating layer to extend through said aperture and make ohmic contact to said gate region.

2. A method for fabricating a JFET as set forth in claim 1, wherein said first and second patterned masks are formed by an electron beam to define a meandering pattern producing a maximum channel length in the area occupied by the JFET.

3. A method for forming a JFET as set forth in claim 1, wherein implanting conductivity modifying ions through a first patterned mask over a high resistivity substrate of one conductivity type to form a first region of opposite conductivity extending to the surface thereof is characterized by a series of implantations controlled to produce a substantially uniform impurity profile in said channel region.

4. A method for fabricating a JFET as set forth in claim 2, including forming bonding pads on the surface of said substrate at both ends of said meandering pattern.

5. A method for fabricating a JFET as set forth in claim 1, wherein said substrate is intrinsic p-type silicon.

6. A method for fabricating a JFET having improved operating characteristics comprising the steps of:

(a) implanting conductivity modifying ions through a first patterned mask over a high resistivity substrate of one conductivity type to form a first region of opposite conductivity extending to the surface thereof;

(b) implanting conductivity modifying ions through a second patterned mask to convert regions laterally adjacent opposite sides of the center portion of said first region to relatively high conductivity regions, thereby forming contact pads for the source and drain respectively, the center portion of said first region defining the channel of said JFET; and (c) metallizing a thin layer of high conductivity metal over said center portion to make rectifying contact therewith to form a Schottky barrier gate region for said JFET.

7. In a process for the fabrication of a semiconductor device, the improved method of forming critically small ion-implanted regions in a semiconductor body, comprising the steps of:

(a) patterning an ion implantation mask on a surface of said semiconductor body with the use of an electron beam to provide a narrow aperture in said mask having a width no greater than about 1 micron; and (b) impinging an ion beam on the masked surface of said semiconductor body, said beam having sufficient energy to form a region of implanted ions in said semiconductor body, said implanted region having a width no greater than about 1 micron.

8. A method as defined by claim 7 further including the step of controlling the energy of said ion beam to provide a sequence of implants at varying depths whereby the resulting dopant profile is substantially uniform as a function of depth.

References Cited

UNITED STATES PATENTS

| | | | |
|---|---|---|---|
| 3,413,531 | 11/1968 | Leith | 317—235 |
| 3,560,278 | 2/1971 | Sanera | 148—187 |
| 3,434,894 | 3/1969 | Gale | 148—187 |
| 3,341,754 | 9/1967 | Kellett | 317—234 |
| 3,001,111 | 9/1961 | Chappey | 317—235 |
| 3,575,732 | 4/1971 | Uhlir, Jr. | 148—15 |
| 3,258,898 | 7/1966 | Garibotti | 29—155.5 |
| 3,112,850 | 12/1963 | Garibotti | 225—2 |
| 3,620,851 | 11/1971 | King | 148—1.5 |
| 3,520,741 | 7/1970 | Mankarious | 148—175 |
| 3,165,430 | 1/1965 | Hugle | 148—187 |

MARTIN H. EDLOW, Primary Examiner

U.S. Cl. X.R.

317—235 A, 235 AY, 235 AM; 29—577, 580, 582